United States Patent
Cox et al.

(10) Patent No.: US 10,700,547 B2
(45) Date of Patent: Jun. 30, 2020

(54) EMERGENCY LOCATING TRANSMITTER WITH ALKALINE BATTERY AND SUPERCAPACITOR POWER SUPPLY

(71) Applicants: William Cox, Sunrise, FL (US); Isaac Johnson, Fort Lauderdale, FL (US); Irek Gora, Fort Lauderdale, FL (US)

(72) Inventors: William Cox, Sunrise, FL (US); Isaac Johnson, Fort Lauderdale, FL (US); Irek Gora, Fort Lauderdale, FL (US)

(73) Assignee: ACR ELECTRONICS, INC., Fort Lauderdale, FL (US)

( * ) Notice: Subject to any disclaimer, the term of this patent is extended or adjusted under 35 U.S.C. 154(b) by 129 days.

(21) Appl. No.: 15/962,288

(22) Filed: Apr. 25, 2018

(65) Prior Publication Data

US 2019/0131821 A1    May 2, 2019

Related U.S. Application Data

(60) Provisional application No. 62/490,692, filed on Apr. 27, 2017.

(51) Int. Cl.
| | |
|---|---|
| H02J 9/06 | (2006.01) |
| G01S 5/02 | (2010.01) |
| B64D 45/00 | (2006.01) |
| H01M 6/04 | (2006.01) |
| H02J 7/34 | (2006.01) |
| H03K 5/24 | (2006.01) |

(52) U.S. Cl.
CPC .............. *H02J 9/061* (2013.01); *B64D 45/00* (2013.01); *G01S 5/02* (2013.01); *G01S 5/0231* (2013.01); *H01M 6/04* (2013.01); *H02J 7/345* (2013.01); *H03K 5/24* (2013.01); *B64D 2045/0065* (2013.01)

(58) Field of Classification Search
CPC ......... H02J 9/061; H02J 7/345; G01S 5/0231; G01S 5/02; B64D 45/00; B64D 2045/0065; H01M 6/04; H03K 5/24
See application file for complete search history.

(56) References Cited

U.S. PATENT DOCUMENTS

| | | | | |
|---|---|---|---|---|
| 7,642,755 | B2 * | 1/2010 | Bartilson | B60K 6/28 320/167 |
| 7,786,620 | B2 * | 8/2010 | Vuk | H01M 10/4264 307/66 |
| 8,687,375 | B2 * | 4/2014 | Uy | G01S 5/0231 361/754 |
| 9,689,366 | B2 * | 6/2017 | Kirlew | F02N 11/0866 |
| 2010/0060231 | A1 * | 3/2010 | Trainor | H01G 11/14 320/103 |

(Continued)

*Primary Examiner* — Pinping Sun
(74) *Attorney, Agent, or Firm* — Malin Haley DiMaggio & Bowen, P.A.

(57) ABSTRACT

An improved D.C. power supply for an emergency locator transmitter ELT mounted on an aircraft that does not require lithium batteries but instead uses conventional alkaline batteries in conjunction with a supercapacitor network to provide a reliable power source even when the ELT that is airborne is subjected to extreme cold temperatures that can affect the alkaline battery operation. Alkaline battery pack with a 12 V output is connected to a supercapacitor network board. The supercapacitors are charged when the ELT is activated ON using the comparator network.

3 Claims, 1 Drawing Sheet

(56) References Cited

U.S. PATENT DOCUMENTS

| | | | | |
|---|---|---|---|---|
| 2011/0080134 A1* | 4/2011 | Miller | ............... | H02J 7/345 |
| | | | | 320/101 |
| 2015/0001926 A1* | 1/2015 | Kageyama | ............ | B60R 16/033 |
| | | | | 307/10.1 |
| 2015/0134154 A1* | 5/2015 | Colin | ............... | G01C 21/20 |
| | | | | 701/14 |
| 2015/0270776 A1* | 9/2015 | Mallik | ............ | H02M 3/156 |
| | | | | 307/31 |
| 2015/0330116 A1* | 11/2015 | Dente | ............... | B60L 58/12 |
| | | | | 307/10.1 |
| 2017/0247118 A1* | 8/2017 | Adler | ............... | B64D 45/00 |

* cited by examiner

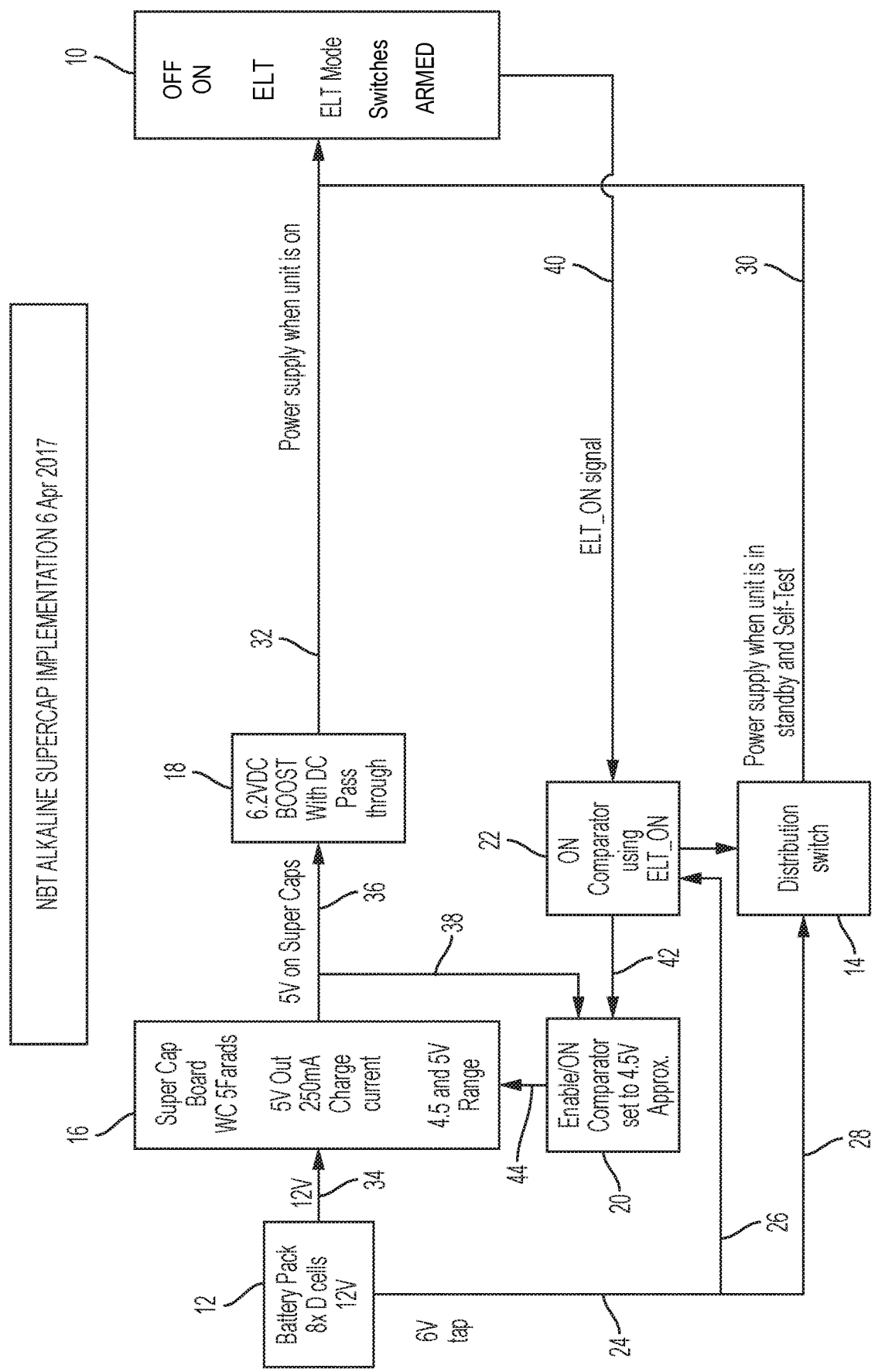

EMERGENCY LOCATING TRANSMITTER WITH ALKALINE BATTERY AND SUPERCAPACITOR POWER SUPPLY

This application claims priority to U.S. Provisional Application No. 62/490,692 filed on Apr. 27, 2017.

FIELD OF THE INVENTION

This invention relates to a safe DC power supply for an emergency locator transmitter (ELT) installed in a commercial aircraft, eliminating the use of lithium batteries on board the aircraft.

DESCRIPTION OF RELATED ART

Emergency locator transmitters (ELTs) are well known in the prior art. The device has its own independent battery power supply and is mounted in an aircraft and if the aircraft crashes, the device will transmit an emergency signal to its surroundings including satellites with information concerning the location of the aircraft at the crash site.

Commercial jet aircraft are subject to extremely low temperatures while flying at high altitudes. Lithium batteries have been utilized in the past in ELTs as a suitable power supply because lithium batteries operate satisfactorily at low temperatures. However there have been incidents of lithium battery fires from self-igniting and exploding, undesirable events in an aircraft. Alkaline batteries have been deficient as a power supply for ELTs because of their poor performance in extremely cold environments.

The device described in this invention overcomes the inherent problems previously found in using an alkaline battery in an ELT by providing an improved ELT power supply that includes alkaline batteries and supercapacitor networks that can safely and efficiently supply power to an ELT when necessary, regardless of temperature extremes on board an aircraft.

SUMMARY OF THE INVENTION

An independent D.C. power supply for a conventional emergency locator transmitter (ELT) for use in an aircraft for locating the position of an aircraft in the event of a crash. The ELT typically includes an RF transmitter, an antenna connected to said transmitter, a secure housing for said transmitter, a CPU connected to said transmitter, and an accelerometer connected to said CPU for activating said transmitter in the event of a crash.

The ELT is powered by its own D.C. power source that in accordance with the invention includes alkaline batteries and supercapacitors that together provide DC power for an ELT arming circuit and a self-test circuit, and DC power for an emergency ON mode due to a crash or manual activation. An alkaline battery pack 12V output is connected to a supercapacitor network board. The supercapacitors are charged when the ELT is activated ON using a comparator network. Supercapacitors provide power to the ELT through a D.C. boost with D.C. pass through when the ELT is activated ON, either from a crash or manual turn on.

The device uses two voltage levels by way of voltage taps on the battery pack; one 6V voltage level is for self-test and arming or standby and one voltage level is to charge the supercapacitors when the ELT unit is turned ON.

The battery pack output includes a six volt tap to a distribution switch to power the ELT in the armed mode (standby) and self-test.

It is an object of this invention to provide an improved DC power supply for an ELT mounted on an aircraft that does not require lithium batteries, but instead uses conventional alkaline batteries in conjunction with a supercapacitor network to provide a reliable power source even when the unit is subjected to extreme temperatures that can affect the alkaline battery operation.

BRIEF DESCRIPTION OF THE DRAWING

The drawing shows a circuit diagram of the D.C. power supply for an ELT using an alkaline battery pack and supercapacitors in accordance with the invention.

DETAILED DESCRIPTION OF THE INVENTION

Referring now to the drawing, an ELT DC power supply is shown in accordance with the invention for a conventional ELT 10 that could be permanently mounted in a commercial aircraft such as a Boeing 737 for emergency use. The ELT DC power supply includes an alkaline battery pack 12 that can include 8 "D" cells of 1.5 V each, for a total of 12 V from the battery pack 12. The DC power supply circuitry includes a distribution switch 14.

The ELT 10 has two modes of operation. The ARMED mode is the normal configuration during a conventional flight. No emergency RF signals are transmitted from the ELT in the ARMED configuration. The distribution switch 14 provides for a 6 V tap from the battery pack 12 through circuit 24 and circuit 28 to the ELT 10 which is the power supply for the ARMED mode and also provides for self-test through circuit 30 which provides power supply when the ELT is in standby and self-test modes.

The power supply shown in the drawing is controlled by the activation of the ELT ON and the distribution switch 14 and functions differently in different modes.

The battery pack 12 has a 6 V tap output wire 24 and 28 to the distribution switch 14 that supplies power to the ELT when the unit is ARMED and for self-test. The battery pack 12 also provides a 6 V tap to comparator 22 through circuit 24 and circuit 26. In the ARMED configuration, the super capacitors on the supercapacitor board 16 are not charged in the ARMED mode.

In the event of a crash, the accelerometer circuitry in ELT 10 will turn ON, sending an ON signal through circuits 40 and 42 to comparator 22. ON comparator through circuit 42 will enable comparator 20 to send voltage to the supercapacitors on supercapacitor board 16 through circuit 44 charging the supercapacitors between 4.5 and 5 V. Comparator is an enable/on switch set to approximately 4.5 V. The super capacitor board 16 has WC 5 Farads with a 5 V output and 250 mA charge current in a 4.5 and 5 volt range. The charged supercapacitors 16 will then provide power through a 6.2 DC boost with DC pass through element 18 and circuits 36 and 32 to supply the power necessary for the ELT 10 to transmit emergency RF signals that give position location of the crash. Circuit 32 represents the power supply when the ELT is on. Note that the ELT 10 can also be manually turned ON to the emergency transmit mode by the pilot in the cockpit. Circuit 38 provides voltage to comparator 20.

The use of two voltage sources enables an active system to fail and still be able to operate adding redundancy. Low current charging rate and hysteresis allow the extraction of more energy during times when the internal resistances of batteries increase such as extreme temperatures and low charge level. Batteries are buffered from the ELT unit in activated state.

Using the invention described herein, an ELT can be safely operated and dependably operated using alkaline batteries which can replace lithium batteries without a degradation of performance and dependability.

The invention claimed is:

1. A D.C. power supply for an emergency locator transmitter (ELT) for an aircraft comprising:
    at least one alkaline battery;
    a super capacitor having a DC power input and a DC discharge output;
    a distribution switch connected to said at least one alkaline battery and connectable to an ELT arming switch for arming said ELT;
    a voltage comparator connected to said at least one alkaline battery connected to an output of said super capacitor, and connected to an ELT ON switch;
    a voltage boost circuit connected to the output of said super capacitor and to an input of an ELT mode switch circuitry;
    whereby when said ELT on switch is activated, activation power is provided to said ELT by the output of said super capacitor output and an output of said voltage boost circuit.

2. A D. C. power supply as in claim 1 including:
    a voltage tap connected to the output of said at least one alkaline battery providing voltage to said distribution switch to provide power for an armed mode and a self-test mode of the ELT.

3. A method of providing D. C. power to an emergency locator transmitter (ELT) located on an aircraft using a power supply having alkaline batteries comprising steps of:
    a) providing an alkaline battery power supply for the ELT mounted on an aircraft;
    b) providing said ELT with three modes of operation including off, armed, and on;
    c) providing a power distribution switch connected to said power supply having said alkaline batteries and an ELT armed mode switch;
    d) providing a board with a super capacitor;
    e) providing a comparator connected to an output of said power supply having said alkaline batteries and an ON mode switch of said ELT and having an output connected to said super capacitor for charging said super capacitor;
    f) providing a boost voltage connected to an output of said super capacitor and to an input of said ELT ON mode switch of said ELT;
        whereby when said ELT is switched on, comparator turns on and provides voltage to charge said super capacitor through voltage from said power supply having said alkaline batteries and providing output voltage through said boost voltage to power said ELT.

* * * * *